(12) United States Patent
Knoedgen

(10) Patent No.: US 6,603,293 B2
(45) Date of Patent: Aug. 5, 2003

(54) POWER SUPPLY REJECTION RATIO OPTIMIZATION DURING TEST

(75) Inventor: Horst Knoedgen, Munich (DE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 0 days.

(21) Appl. No.: 09/996,257

(22) Filed: Nov. 28, 2001

(65) Prior Publication Data
US 2003/0094932 A1 May 22, 2003

(30) Foreign Application Priority Data
Nov. 19, 2001 (EP) .......................... 01480115

(51) Int. Cl.⁷ .............................. G05F 1/40; G06G 7/12
(52) U.S. Cl. ........................ 323/280; 327/560; 331/135
(58) Field of Search .............................. 323/313, 280, 323/282, 235, 283; 363/131, 16, 97, 98; 330/149; 331/34, 135; 327/540, 536, 541, 542, 560, 543

(56) References Cited

U.S. PATENT DOCUMENTS

| | | | |
|---|---|---|---|
| 5,150,072 A | * 9/1992 | Malec | 330/149 |
| 5,479,337 A | * 12/1995 | Voigt | 363/131 |
| 5,686,821 A | 11/1997 | Brokaw | 323/273 |
| 5,691,663 A | 11/1997 | Nayebi et al. | 327/560 |
| 5,770,972 A | * 6/1998 | Freuler et al. | 330/149 |
| 5,910,886 A | 6/1999 | Coleman | 363/17 |
| 5,936,460 A | 8/1999 | Iravani | 327/543 |
| 6,157,180 A | 12/2000 | Kuo | 323/282 |
| 6,246,221 B1 | * 6/2001 | Xi | 323/280 |

FOREIGN PATENT DOCUMENTS

| | | | |
|---|---|---|---|
| EP | 0526423 A1 | 7/1992 | H03F/3/45 |
| EP | 0614136 A1 | 3/1993 | G05F/1/613 |
| EP | 0598578 A2 | 11/1993 | H03F/3/30 |

OTHER PUBLICATIONS

Walt Jung, "Very–Low–Noise 5–V Regulator", Electronic Design, Penton Publishing, Cleveland, OH, US, vol. 42, No. 15, Jul. 25, 1994, p. 92.

* cited by examiner

Primary Examiner—Rajnikant B. Patel
(74) Attorney, Agent, or Firm—George O. Saile; Stephen B. Ackerman; Douglas R. Schnabel

(57) ABSTRACT

A regulated voltage supply circuit having improved power supply rejection ratio is achieved. The circuit comprises, first, a voltage follower having an input, an output, and a power supply voltage. The input is coupled to a reference voltage. The output comprises the regulated voltage supply. Second, a means of compensating noise on the power supply voltage comprises phase shifting the power supply voltage 180 degrees and feeding back the phase shifted power supply voltage to the voltage follower input to thereby improve power supply rejection ratio. The means of compensating noise may comprise an adjustable gain. This adjustable gain may further comprise an adjustable value resistance. The adjustable gain is used in a to optimize the PSRR by testing comprising modulating noise on the power supply voltage, measuring the noise on the regulated voltage supply, and adjusting the gain.

20 Claims, 4 Drawing Sheets

POWER SUPPLY REJECTION RATIO OPTIMIZATION DURING TEST

BACKGROUND OF THE INVENTION (1) Field of the Invention

The invention relates to a regulated voltage supply circuit, and more particularly, to a regulated voltage supply circuit with noise compensation to optimize the power supply rejection ratio (PSRR).

(2) Description of the Prior Art

Regulated voltage supply circuits are used to create controlled voltage supplies for electronic systems. A common problem, which must be overcome in a voltage regulator circuit, is the coupling of noise from the power supply onto the regulated voltage line. This power supply noise can come from a variety of sources including digital and analog switching or external coupling. If this noise is carried in the regulated supply, then it will affect all of the circuits connected to this supply. This supply noise is especially problematic for sensitive analog circuits such as analog-to-digital converters and linear signal processing circuits.

A measure of the amount of power supply noise that is coupled onto the regulated supply is the power supply rejection ratio (PSRR). PSRR is calculated by dividing the ac noise signal present on the regulated dc voltage by the ac noise signal present on the unregulated power supply. It is typically desired that the PSRR be made as low as possible within the other design constraints for the regulator circuit.

Referring now to FIG. 1, an exemplary prior art method for optimizing PSRR is shown. A voltage follower circuit 58 comprising an amplifier is used to generate a regulated supply VOUT 50. The non-inverting input of this amplifier 58 is coupled to a reference voltage VREF 40 through the reference resistance $R_{REF}$ 54. The amplifier 58 is configured to voltage follow the reference voltage VREF 40 onto the output VOUT 50 while providing a low impedance output capable of driving all of the circuits for the regulated supply VOUT 50. The power supply, in this case is a battery, VBATT 30. To improve the PSRR performance, VBATT 30 is coupled to a low drop voltage regulator, or LDO, circuit 70.

The LDO circuit 70 and the capacitor 62 filter are used to create a filtered version VBF 66 of the power supply VBATT 30. Much of the power supply noise is filtered away before VBF 66 couples to the amplifier 58. Therefore, the PSRR response of the regulator circuit is improved. The prior art example has the disadvantage of the size and cost of the LDO circuit 70 and the capacitor 62. In addition, noise that is not filtered by the LDO and the capacitor is coupled directly onto the regulator amplifier 58.

Several prior art inventions describe power supply regulators and PSRR. U.S. Pat. No. 6,157,180 to Kuo describes a power supply regulator circuit with increased supply noise rejection ratio. The regulator uses a voltage follower circuit to buffer a reference voltage. The circuit topography eliminates compensation capacitance to thereby enhance the rejection ratio. U.S. Pat. No. 5,686,821 to Brokaw describes a single-loop voltage regulator. U.S. Pat. No. 5,910,886 to Coleman discloses a phase-shift power supply for use in a plasma deposition apparatus.

SUMMARY OF THE INVENTION

A principal object of the present invention is to provide an effective and very manufacturable regulated voltage supply circuit.

A further object of the present invention is to provide a regulated voltage supply circuit with optimized PSRR.

A still further object of the present invention is to optimize PSRR by a noise compensation circuit where noise on the power supply is phase shifted by 180 degrees and then added to the voltage reference of the regulator.

Another still further object of the present invention is to make the noise compensation circuit gain adjustable.

Another still further object of the present invention is to adjust the noise compensation gain by modulating noise on the power supply, measuring the noise on the regulated supply, and adjusting the gain to optimize the PSRR.

Yet another still further object of the present invention is to make the noise compensation circuit adjustable using an adjustable value resistor.

In accordance with the objects of this invention, a regulated voltage supply circuit having improved power supply rejection ratio is achieved. The circuit comprises, first, a voltage follower having an input, an output, and a power supply voltage. The input is coupled to a reference voltage. The output comprises the regulated voltage supply. Second, a means of compensating noise on the power supply voltage comprises phase shifting the power supply voltage 180 degrees and feeding back the phase shifted power supply voltage to the voltage follower input to thereby improve power supply rejection ratio. The means of compensating noise may comprise an adjustable gain. This adjustable gain may further comprise an adjustable value resistance. The adjustable gain is used in a to optimize the PSRR by testing comprising modulating noise on the power supply voltage, measuring the noise on the regulated voltage supply, and adjusting the gain.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel regulated voltage supply circuit. The circuit uses a noise compensation sub-circuit to achieve excellent power supply rejection ratio (PSRR) performance. A method is disclosed to optimize the PSPR of the circuit by adjusting the gain of the noise compensation stage. It should be clear to those experienced in the art that the present invention can be applied and extended without deviating from the scope of the present invention.

Figure 1:
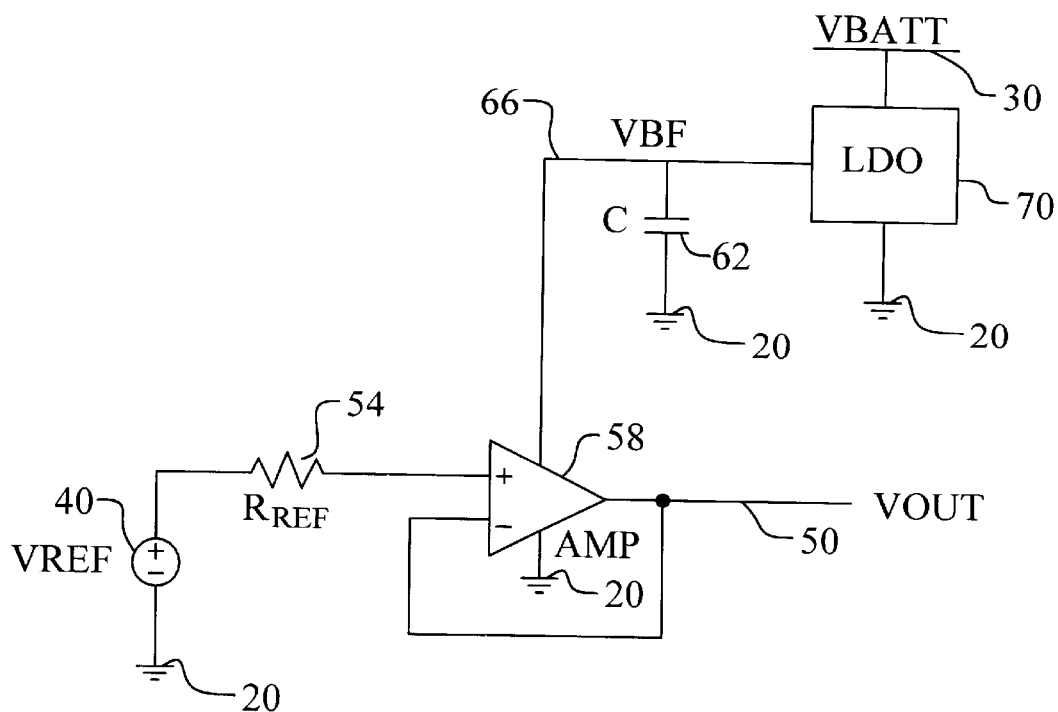
FIG. 1 illustrates a prior art regulated voltage supply circuit with PSRR reduction by a CDO circuit.
Figure 2:
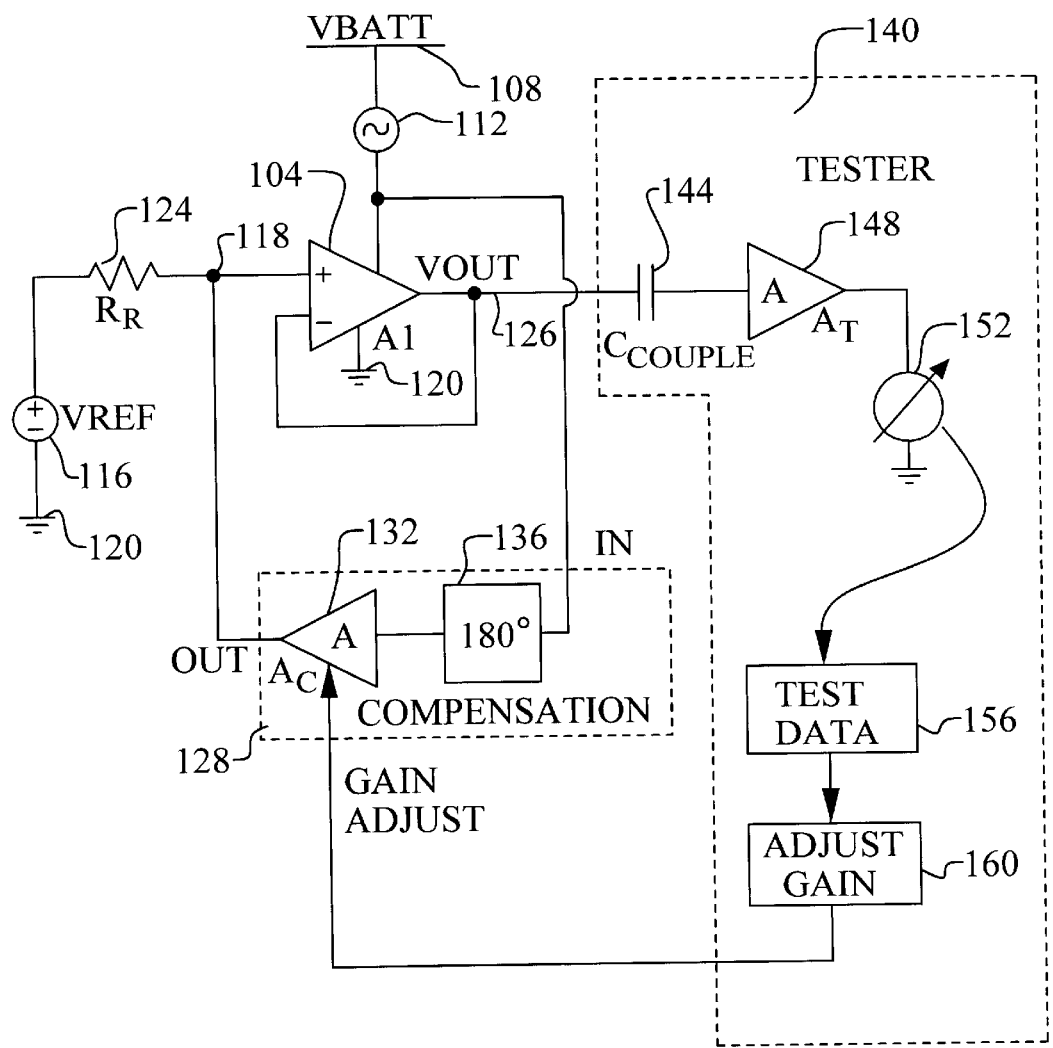
FIG. 2 illustrates the preferred embodiment of the regulated voltage supply circuit of the present invention.

Referring now to FIG. 2, the first preferred embodiment of the regulated voltage supply circuit of the present invention is illustrated. Several Important features of the present invention are shown. The circuit comprises, first, a voltage follower A1 104. The voltage follower has an input, an output, and a power supply voltage VBATT 108. The non-inverting input to the voltage follower 104 is coupled at node 118 to a reference voltage VREF 116 through the reference resistance $R_R$ 124. The output VOUT 126 of the voltage follower 104 is coupled to the inverting input. In this configuration, the amplifier A1 104 follows the reference voltage 116 onto VOUT 126. The amplifier provides a low impedance, large current capacity regulated voltage supply at VOUT.

The second major component, of the preferred embodiment is a means of compensating noise 128 on the power supply voltage. The means of compensating noise 128 comprises a means to phase shift the power supply voltage 180 degrees 136 and a means of feeding back 132 the phase shifted power supply voltage to the voltage follower 104 input to thereby improve power supply rejection ratio. The power supply voltage VBATT 108 is coupled to the input of the noise compensation block 128. The phase shifted signal is the output of the compensation block 128 and is coupled to the reference voltage node 118 of the circuit.

In the preferred embodiment, the noise compensation block 128 comprises a phase shift block 136 and a gain block $A_c$ 132. As will be illustrated in FIG. 4, the phase shift block and gain block may be combined in the circuit implementation.

The novel regulated voltage supply circuit operates by using the noise compensation block 128 to cancel noise in the power supply VBATT 108. The noise signal is modeled on the schematic as an AC voltage 112 that is carried on the DC supply signal VBATT 108 or as a dc voltage coupling. This combined AC and DC supply is the sourcing supply for the voltage follower amplifier A1 104. As such, the noise 112 on the power supply could logically be coupled onto the output VOUT 126 to create a poor PSRR. However, the noisy supply 108 and 112 is also coupled into the noise compensation circuit 128. The AC or noise component of the supply voltage is shifted 180 degrees out of phase 136 and then amplified 132 before being fed back to the voltage follower 104 input 118. The presence the phase shifted noise at the amplifier 104 input causes a modulation or combining of the original noise 112 and the phase shifted noise. The result is a cancellation of supply noise on the output line VOUT 126 by as much as several orders of magnitude. For example, an about 10 KHz noise (audio range) signal 112 of magnitude about 500 millivolts may be reduced to a regulated supply voltage VOUT noise of about 500 microVolts or even about 50 microvolts. This represents a noise reduction, or PSRR improvement, of 3 to 4 orders of magnitude. At lower frequencies, such as 100 Hz, the PSRR of the device is normally okay.

As a further improvement to the circuit of the present invention, a method to optimize the PSRR value during testing is also achieved. The circuit schematic of FIG. 2 includes a tester 140. The tester comprises a means to couple in the AC component of the regulated voltage VOUT preferably comprising a capacitor $C_{COUPLE}$ 144. An amplifier AT 148 is used to amplifier this noise. A measuring system 152, such as an oscilloscope or an automated tester, is used to measure the magnitude of the noise. This test data is stored 156 and used to derive an adjustment to the gain 160 of the noise compensation circuit 128.

Figure 3:
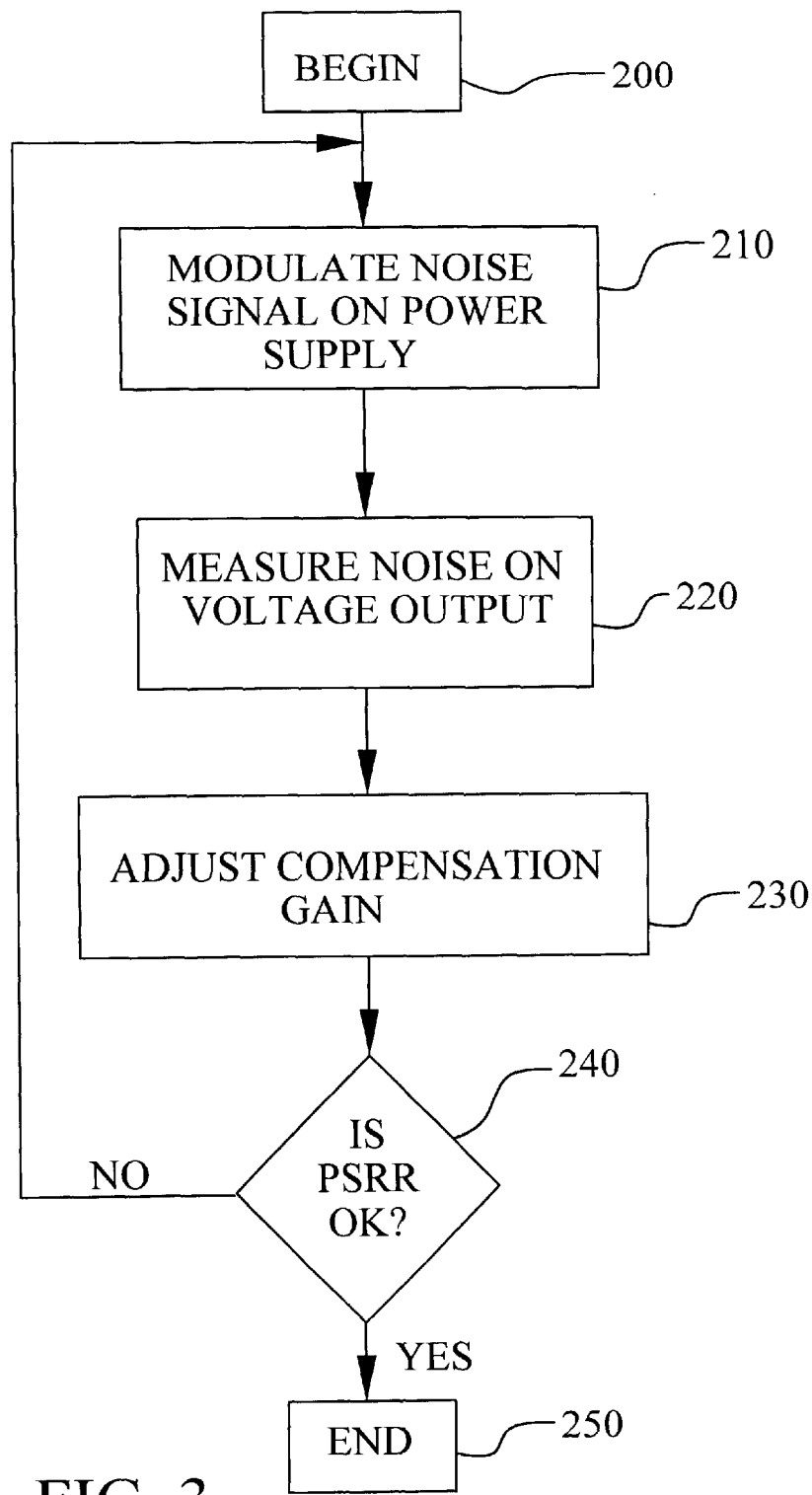
FIG. 3 illustrates the preferred embodiment of the method to optimize the PSRR performance of the circuit of the present invention.

Referring now to FIG. 3, the optimization method is shown. The testing sequence begins in step 200. The noise signal 112 is modulated onto the power supply 108 signal in step 210. Preferably, the noise signal comprises an amplitude of between about 10 mV and 400 mV and a frequency of between about 10 Hz and about 30 KHz. The noise on the regulated voltage line VOUT 126 is measured by the tester and stored in step 220. The measured value is used to make an adjustment to the compensating gain is step 230. This adjustment may be calculated or may be derived from a look up table. The steps of modulating, measuring, and adjusting, steps 210 to 230, are repeated until the PSRR is optimized or reaches an acceptable value for the design in step 240.

Figure 4:
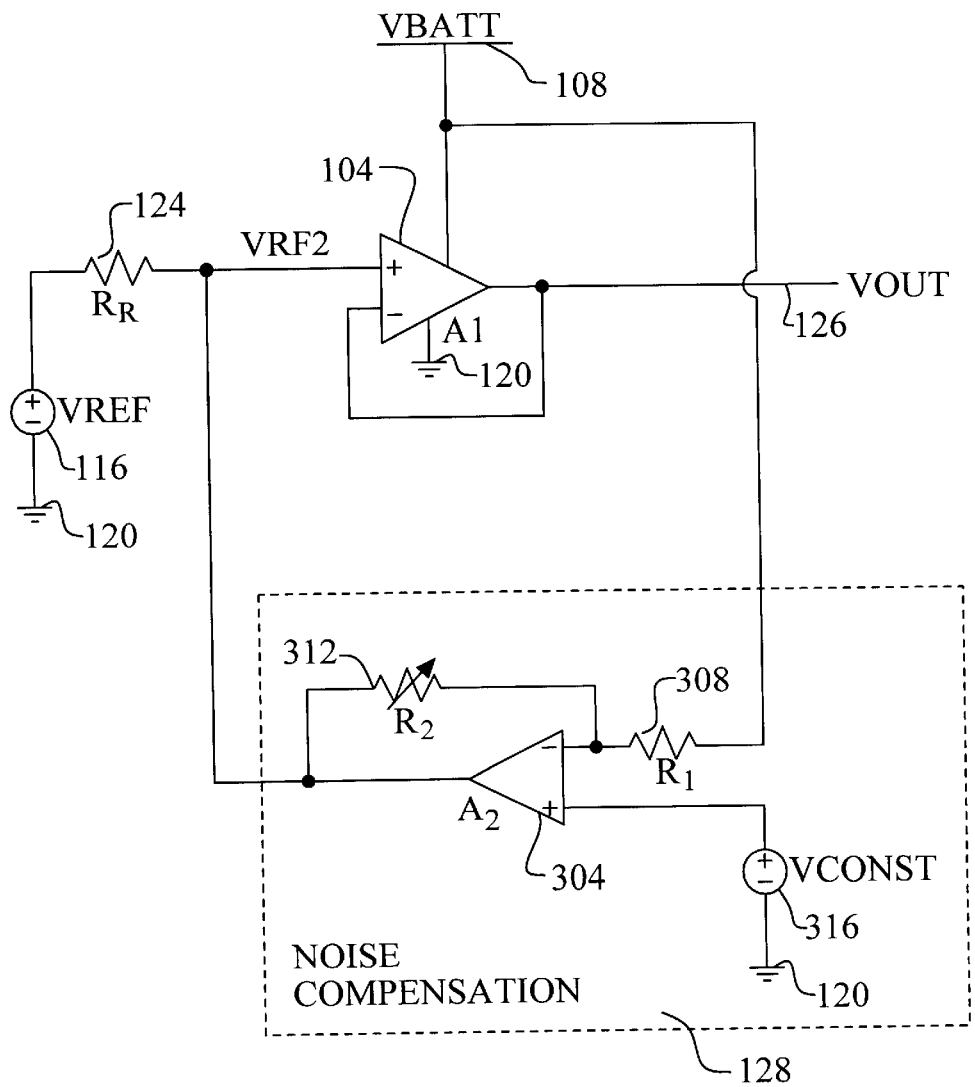
FIG. 4 illustrates the preferred embodiment of the noise compensation circuit of the present invention.

Referring now to FIG. 4, a preferred embodiment of the noise compensating circuit is shown. The reference voltage 116 and voltage follower A1 104 section remains as shown in FIG. 2. However, an amplifier circuit is shown which implements the phase shifting and amplification functions of the noise compensation circuit 128. An amplifier A2 304 has an inverting and a non-inverting input. The non-inverting input is coupled to a constant voltage source 316. This constant voltage source may comprise the reference voltage VREF 116. The power supply voltage VBATT 108 Is coupled to the inverting input of A2 304 through resistor R 308. The output of A2 304 is coupled to the inverting input through resistor $R_2$ 312.

The components, $R_1$ 308, $R_2$ 312, and A2 304, form an inverting amplifier circuit. An AC analysis of the circuit shows the transfer function:

$$VRF2 = -VBATT \times (R_2/R_1).$$

This means that the AC signal response is a 180 degree phase shift and a gain of $R_2/R_1$. Therefore, the noise on the power supply line VBATT 108 is coupled back to the input for cancellation. The DC response of the circuit is complicated by the fact that both the reference voltage VREF 116 and the inverting amplifier 304, 308, and 312 are driving the VRF2 node. In practice, the circuit is compensating either an AC noise or a DC offset using the same amplifier. The reference voltage 116 must therefore be proportional to the VBATT voltage 108.

As discussed above, the gain of the compensation block 128 may be adjusted to further optimize PSRR performance. In the circuit implementation of FIG. 4, the second resistor $R_2$ 312 is adjustable. By adjusting the value of $R_2$ 312, the gain $(R_2/R_1)$ can be increased or decreased. Further, the variable resistor $R_2$ 312 is ideally suited to the optimization during test method as described above and in FIG. 3.

The compensation scheme of the present invention is applicable to voltage regulator circuits. It may be extended to apply to low drop out (LDO) regulators. If the concept is applied to a LDO regulator, then the noise frequency should range should extend to above 100 KHz, with a typical value of about 100 KHz. Further, the compensation circuit may be applied to improve the PSRR of power circuits such as Class D audio amplifiers.

The advantages of the present invention may now be summarized. The present invention provides an effective and very manufacturable regulated voltage supply circuit. The regulated voltage supply circuit has an optimized PSRR by a noise compensation circuit where noise on the power supply is phase shifted by 180 degrees and then added to the voltage reference of the regulator. Further, the noise compensation circuit is gain adjustable.

This noise compensation gain is adjusted by modulating noise on the power supply, measuring the noise on the regulated supply, and adjusting the gain to optimize the PSRR. Finally, the noise compensation can use a variable value resistor for implementing the adjustable gain.

As shown in the preferred embodiments, the novel circuit provides an effective and manufacturable alternative to the prior art.

While the invention has been particularly shown and described with reference to the preferred embodiments thereof, it will be understood by those skilled in the art that various Ad changes in form and details may be made without departing from the spirit and scope of the invention.

What is claimed is:

1. A circuit having improved power supply rejection ratio, said circuit comprising:
   a voltage follower having an input, an output, and a power supply voltage wherein said input is coupled to a reference voltage;
   a means of compensating noise on said power supply voltage by phase shifting said power supply voltage 180 degrees and feeding back said phase shifted power supply voltage to said voltage follower input to thereby improve power supply rejection ratio.

2. The circuit according to claim 1 wherein said circuit comprises a regulated power supply.

3. The circuit according to claim 1 wherein said circuit comprises a low drop regulator power supply.

4. The circuit according to claim 1 wherein said circuit comprises a Class D audio amplifier.

5. The circuit according to claim 1 wherein said means of compensating noise comprises an adjustable gain.

6. The circuit according to claim 5 wherein said adjustable feedback gain is adjusted to optimize said power supply rejection ratio by a method comprising:
   modulating a noise signal on said power supply of said gain stage;
   measuring said regulated voltage supply to detect propagation of said noise signal;
   adjusting said adjustable gain; and
   repeating until said propagated noise is minimized.

7. The circuit according to claim 6 wherein said noise signal comprises an amplitude of between about 10 mV and about 400 mV and a frequency of between about 10 Hz and about 30 KHz.

8. The circuit according to claim 1 wherein said means of compensating noise comprises an amplifier having a non-inverting input coupled to a constant voltage, having an inverting input coupled to said power supply voltage through a first resistor, and having an output coupled to said inverting input through a second resistor.

9. The circuit according to claim 8 wherein said second resistor value is adjustable to thereby create an adjustable gain.

10. The circuit according to claim 9 wherein said adjustable gain is adjusted to optimize said power supply rejection ratio by a method comprising:
    modulating a noise signal on said power supply of said gain stage;
    measuring said regulated voltage supply to detect propagation of said noise signal;
    adjusting said adjustable gain by altering said second resistor value; and
    repeating until said propagated noise is minimized.

11. The circuit according to claim 10 wherein said noise signal comprises an amplitude of between 10 mV and about 400 mV and a frequency of between about 10 Hz and about 30 KHz.

12. A regulated voltage supply circuit having improved power supply rejection ratio, said circuit comprising:
    a voltage follower having an input, an output, and a power supply voltage wherein said input is coupled to a reference voltage and said output comprises said regulated voltage supply;
    a means of compensating noise on said power supply voltage by phase shifting said power supply voltage 180 degrees and feeding back said phase shifted power supply voltage to said voltage follower input to thereby improve power supply rejection ratio wherein said means of compensating noise comprises an amplifier having a non-inverting input coupled to a constant voltage, having an inverting input coupled to said power supply voltage through a first resistor, and having an output coupled to said inverting input through a second resistor.

13. The circuit according to claim 12 wherein said means of compensating noise comprises an adjustable gain.

14. The circuit according to claim 13 wherein said adjustable feedback gain is adjusted to optimize said power supply rejection ratio by a method comprising:
    modulating a noise signal on said power supply of said gain stage;
    measuring said regulated voltage supply to detect propagation of said noise signal;
    adjusting said adjustable gain; and
    repeating until said propagated noise is minimized.

15. The circuit according to claim 14 wherein said noise signal comprises an amplitude of between 10 mV and about 400 mV and a frequency of between about 10 Hz and about 30 KHz.

16. The circuit according to claim 14 wherein said second resistor value is adjustable to thereby create an adjustable gain.

17. The circuit according to claim 16 wherein said adjustable feedback gain is adjusted to optimize said power supply rejection ratio by a method comprising:
    modulating a noise signal on said power supply of said gain stage;
    measuring said regulated voltage supply to detect propagation of said noise signal;
    adjusting said adjustable gain by altering said second resistor value; and
    repeating until said propagated noise is minimized.

18. A regulated voltage supply circuit having improved power supply rejection ratio, said circuit comprising:
    a voltage follower having an input, an output, and a power supply voltage wherein said input is coupled to a reference voltage and said output comprises said regulated voltage supply;
    a means of compensating noise on said power supply voltage by phase shifting said power supply voltage 180 degrees and feeding back said phase shifted power supply voltage to said voltage follower input to thereby improve power supply rejection ratio wherein said means of compensating noise comprises an amplifier having a non-inverting input coupled to ground reference, having an inverting input coupled to said power supply voltage through a first resistor, and having an output coupled to said inverting input through a second resistor and wherein said second resistor value is adjustable to thereby create an adjustable gain.

19. The circuit according to claim 18 wherein said adjustable feedback gain is adjusted to optimize said power supply resection ratio by a method comprising:
    modulating a noise signal on sa d power supply of said gain stage;
    measuring said regulated voltage supply to detect propagation of said noise signal;
    adjusting said adjustable gain by altering said second resistor value; and
    repeating until said propagated noise is minimized.

20. The circuit according to claim 19 wherein said noise signal comprises an amplitude of between 10 mV and about 400 mV and a frequency of between about 10 Hz and about 30 KHz.

* * * * *